(12) United States Patent
Braylovskiy et al.

(10) Patent No.: US 9,673,567 B1
(45) Date of Patent: Jun. 6, 2017

(54) APPARATUS, SYSTEM, AND METHOD FOR PREVENTING ELECTRIC SHOCK DURING MAINTENANCE OF TELECOMMUNICATION SYSTEMS

(71) Applicant: Juniper Networks, Inc., Sunnyvale, CA (US)

(72) Inventors: Michael Braylovskiy, San Mateo, CA (US); Jaspal S. Gill, Tracy, CA (US); Muhammad Sagarwala, Los Gatos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 77 days.

(21) Appl. No.: 14/656,644

(22) Filed: Mar. 12, 2015

(51) Int. Cl.
*H01R 13/633* (2006.01)
*H01R 13/447* (2006.01)
*H05K 5/00* (2006.01)

(52) U.S. Cl.
CPC ......... *H01R 13/633* (2013.01); *H01R 13/447* (2013.01)

(58) Field of Classification Search
None
See application file for complete search history.

(56) References Cited

U.S. PATENT DOCUMENTS

| | | | |
|---|---|---|---|
| 6,538,882 B2 * | 3/2003 | Branch | H01R 13/6275 361/679.02 |
| 6,560,114 B2 * | 5/2003 | Berry | H05K 7/1489 312/223.2 |
| 6,749,448 B2 * | 6/2004 | Bright | G02B 6/4201 439/152 |
| 6,793,517 B2 * | 9/2004 | Neer | H05K 5/0256 439/372 |
| 6,839,237 B2 * | 1/2005 | Berry | H05K 7/1489 312/223.2 |
| 6,887,092 B2 * | 5/2005 | Minota | H01R 13/62933 439/160 |
| 6,991,481 B1 * | 1/2006 | Guan | G02B 6/3897 439/160 |
| 7,027,293 B2 * | 4/2006 | Yang | H02B 1/205 200/50.27 |
| 7,083,336 B2 * | 8/2006 | Kim | G02B 6/4292 385/88 |

(Continued)

*Primary Examiner* — Courtney Smith
*Assistant Examiner* — Rashen E Morrison
(74) *Attorney, Agent, or Firm* — FisherBroyles, LLP

(57) ABSTRACT

The disclosed apparatus may include a lock that has a locking mechanism that secures an electronic module to a telecommunication system. The lock may also have an ejection handle coupled to the locking mechanism such that application of physical force to the ejection handle ejects the electronic module from the telecommunication system by undoing the locking mechanism. The disclosed apparatus may also include a cross-bar coupled to the lock and movable in conjunction with the ejection handle. The cross-bar may facilitate access to a row of power connectors arranged along a surface of the electronic module when the ejection handle is positioned in a first position. Additionally or alternatively, the cross-bar may block access to the row of power connectors arranged along the surface of the electronic module when the ejection handle is positioned in a second position. Various other apparatuses, systems, and methods are also disclosed.

18 Claims, 12 Drawing Sheets

(56) References Cited

U.S. PATENT DOCUMENTS

| | | | |
|---|---|---|---|
| 7,090,523 B2 * | 8/2006 | Shirk | G02B 6/4246 439/352 |
| 7,201,520 B2 * | 4/2007 | Mizue | G02B 6/4292 385/92 |
| 7,306,381 B2 * | 12/2007 | Yu | G02B 6/4261 385/92 |
| 7,417,866 B1 * | 8/2008 | Beseth | H05K 7/1409 361/728 |
| 7,422,457 B1 * | 9/2008 | Wu | G02B 6/4201 439/258 |
| 7,513,693 B2 * | 4/2009 | Wang | G02B 6/3897 385/56 |
| 7,517,160 B2 * | 4/2009 | Miyoshi | G02B 6/4261 385/53 |
| 7,559,800 B2 * | 7/2009 | Wu | H01R 13/65802 439/607.3 |
| 7,665,904 B2 * | 2/2010 | Yu | G02B 6/4201 385/135 |
| 7,679,933 B2 * | 3/2010 | Makabe | G06F 1/185 174/365 |
| 7,699,536 B2 * | 4/2010 | Yoshikawa | G02B 6/4246 385/139 |
| 7,738,255 B2 * | 6/2010 | Nishimoto | H05K 7/1402 361/729 |
| 7,883,274 B2 * | 2/2011 | Luo | G02B 6/4284 385/134 |
| 8,111,514 B2 * | 2/2012 | Imsand | G06F 1/181 361/714 |
| 8,506,172 B2 * | 8/2013 | Meadowcroft | G02B 6/4261 385/147 |
| 8,545,252 B2 * | 10/2013 | Wang | H01R 13/6275 439/352 |
| 8,582,299 B1 * | 11/2013 | Phillips | H05K 7/1489 361/724 |
| 8,717,770 B2 * | 5/2014 | Nguyen | G02B 6/4292 361/730 |
| 2003/0002261 A1 * | 1/2003 | Berry | H05K 7/1489 361/727 |
| 2003/0142917 A1 * | 7/2003 | Merrick | G02B 6/4201 385/53 |
| 2004/0033027 A1 * | 2/2004 | Pang | G02B 6/3825 385/53 |
| 2004/0233643 A1 * | 11/2004 | Bolich | H05K 7/1489 361/727 |
| 2004/0235332 A1 * | 11/2004 | Ice | G02B 6/4201 439/352 |
| 2005/0257232 A1 * | 11/2005 | Hidaka | G11B 33/126 720/654 |
| 2006/0078259 A1 * | 4/2006 | Fuchs | G02B 6/4201 385/88 |
| 2006/0221581 A1 * | 10/2006 | DeNies | H05K 7/1461 361/740 |
| 2007/0049099 A1 * | 3/2007 | Potters | H01R 13/6275 439/352 |
| 2007/0223160 A1 * | 9/2007 | Coffey | H02J 1/108 361/62 |
| 2007/0258682 A1 * | 11/2007 | Bright | G02B 6/4292 385/55 |
| 2008/0310136 A1 * | 12/2008 | Huang | G02B 6/4292 361/801 |
| 2009/0279831 A1 * | 11/2009 | Luo | G02B 6/4284 385/53 |
| 2014/0104808 A1 * | 4/2014 | Koutrokois | G02B 6/4246 361/818 |
| 2015/0043883 A1 * | 2/2015 | Barnes, Jr. | G02B 6/4446 385/135 |

* cited by examiner

APPARATUS, SYSTEM, AND METHOD FOR PREVENTING ELECTRIC SHOCK DURING MAINTENANCE OF TELECOMMUNICATION SYSTEMS

BACKGROUND

Telecommunication systems are often used to provide network services to customers of service providers. For example, a telecommunication system may include a rack that houses one or more routers, network switches, and/or electronic modules that facilitate network traffic on behalf of certain customers of a service provider. In this example, at least one of the electronic modules may include and/or represent a field replaceable Power Distribution Unit (PDU). Unfortunately, this field replaceable PDU may cause and/or present a safety hazard when service personnel perform maintenance on the telecommunication system.

For example, the field replaceable PDU may include a front side lined with female power receptacles and a back side lined with male power connectors that interface with the backplane of the telecommunication system. In this example, when power cords are connected to the female power receptacles lining the front side, the male power connectors lining the back side may be energized, thereby potentially exposing service personnel to electric shock upon disconnecting the field replaceable PDU from the backplane for maintenance and/or replacement purposes. The instant disclosure, therefore, identifies and addresses a need for apparatuses, systems, and methods for preventing electric shock during maintenance of telecommunication systems.

SUMMARY

As will be described in greater detail below, the instant disclosure generally relates to apparatuses, systems, and methods for preventing electric shock during maintenance of telecommunication systems. In one example, an apparatus for accomplishing such a task may include a lock that has a locking mechanism that secures an electronic module to a telecommunication system. The lock may also have an ejection handle coupled to the locking mechanism such that application of physical force to the ejection handle ejects the electronic module from the telecommunication system by undoing the locking mechanism. The apparatus may also include a cross-bar coupled to the lock and movable in conjunction with the ejection handle. The cross-bar may facilitate access to a row of power connectors arranged along a surface of the electronic module when the ejection handle is positioned in a first position. Additionally or alternatively, the cross-bar may block access to the row of power connectors arranged along the surface of the electronic module when the ejection handle is positioned in a second position.

Similarly, a system incorporating the above-described apparatus may include an electronic module that interfaces with a telecommunication system. The system may also include a lock coupled to the electronic module. The lock may include a locking mechanism that secures an electronic module to a telecommunication system. The lock may also include an ejection handle coupled to the locking mechanism such that application of physical force to the ejection handle ejects the electronic module from the telecommunication system by undoing the locking mechanism. The system may further include a cross-bar coupled to the lock and movable in conjunction with the ejection handle. The cross-bar may facilitate access to a row of power connectors arranged along a surface of the electronic module when the ejection handle is positioned in a first position. Additionally or alternatively, the cross-bar may block access to the row of power connectors arranged along the surface of the electronic module when the ejection handle is positioned in a second position.

A corresponding method may include coupling an ejection handle that ejects an electronic module from a telecommunication system to a lock that secures the electronic module to the telecommunication system. The method may also include coupling a cross-bar to the lock such that (1) the cross-bar is movable in conjunction with the ejection handle, (2) the cross-bar facilitates access to a row of power connectors arranged along a surface of the electronic module when the ejection handle is positioned in a first position, and (3) the cross-bar blocks access to the row of power connectors arranged along the surface of the electronic module when the ejection handle is positioned in a second position.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
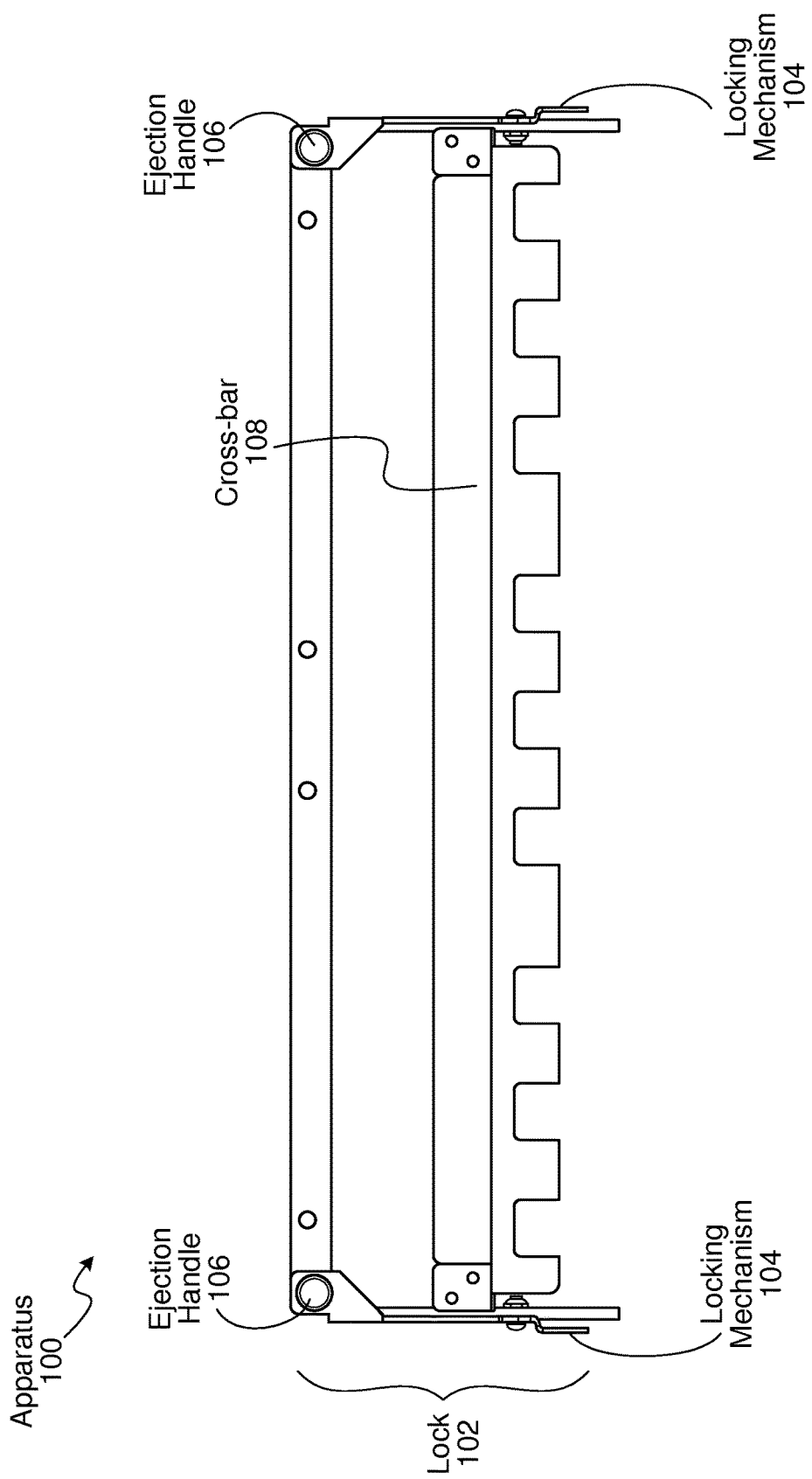
FIG. 1 is an illustration of an exemplary apparatus for preventing electric shock during maintenance of telecommunication systems.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for preventing electric shock during maintenance of telecommunication systems. As will be explained in greater detail below, embodiments of the instant disclosure may provide a mechanical cross-bar that prevents power cords from being plugged into female power receptacles on the front side of an electronic module when the electronic module is disconnected from the backplane of a telecommunication system. In doing so, embodiments of the instant disclosure may be able to prevent electric shock during maintenance of the telecommunication system by physically blocking access to the female power receptacles. For example, the mechanical cross-bar may require service personnel to unplug each of the power cords from the female power receptacles on the front side of the electronic module in order to eject the electronic module from the backplane of the telecommunication system. Since, in this example, the mechanical cross-bar prevents power cords from being plugged into the female power receptacles in this way, the male power connectors included on the back side of the electronic module may not be producing any electric power, thereby mitigating the risk of electric shock to the service personnel.

The following will provide, with reference to FIG. 1, examples of apparatuses that prevent electric shock during maintenance of telecommunication systems. The discussion corresponding to FIG. 2 will provide a detailed description of an exemplary telecommunication system that may incorporate an apparatus for preventing electric shock during maintenance. The discussion corresponding to FIGS. 3, 5, and 7-11 will provide a detailed description of exemplary implementations of an apparatus that prevents electric shock during maintenance of telecommunication systems. The discussion corresponding to FIG. 4 will provide a detailed description of an electronic module that may incorporate an apparatus for preventing electric shock during maintenance of telecommunication systems. The discussion corresponding to FIG. 6 will provide a detailed description of an exemplary lock representing a portion of an apparatus for preventing electric shock during maintenance of telecommunication systems. Finally, the discussion corresponding to FIG. 12 will provide a detailed description of an exemplary method for preventing electric shock during maintenance of telecommunication systems.

FIG. 1 shows an illustration of an exemplary apparatus 100 for preventing electric shock during maintenance of telecommunication systems. The term "maintenance," as used herein, generally refers to any type or form of service and/or repair that involves removing an electronic module from and/or installing an electronic module to a telecommunication system. In one example, such maintenance may be performed by a service worker who removes an electronic module from a telecommunication system to repair and/or replace the electronic module.

As illustrated in FIG. 1, apparatus 100 may include a lock 102 and a cross-bar 108. In one example, lock 102 may include a locking mechanism 104 that secures and/or attaches an electronic module to a telecommunication system. In this example, locking mechanism 104 may include and/or represent one or more hooks that lock the electronic module into the telecommunication system by latching to a corresponding catch, groove, arm, bar, and/or hole on the telecommunication system. Examples of locking mechanism 104 include, without limitation, hooks, bars, latches, catches, grooves, holes, fasteners, variations of one or more of the same, combinations of one or more of the same, or any other suitable locking mechanism.

In one example, lock 102 may also include an ejection handle 106 coupled to locking mechanism 104. In this example, the application of physical force to ejection handle 106 may free and/or eject the electronic module from the telecommunication system by undoing locking mechanism 104. As a result of applying physical force to ejection handle 106 in this way, the electronic module may be disconnected from the backplane of telecommunication system and/or removed from the telecommunication system. Examples of ejection handle 106 include, without limitation, levers, shafts, arms, grips, knobs, buttons, switches, variations of one or more of the same, combinations of one or more of the same, or any other suitable ejection handle.

As a specific example, a service worker may press on ejection handle 106 and/or apply physical force to ejection handle 106. By pressing on ejection handle 106 and/or applying physical force to ejection handle 106 in this way, the service worker may be able to undo locking mechanism 104, thereby effectively freeing and/or ejecting the electronic module from the telecommunication system. Once the electronic module is freed and/or ejected from the telecommunication system, the service worker may be able to remove, repair, and/or replace the electronic module.

Figure 6:
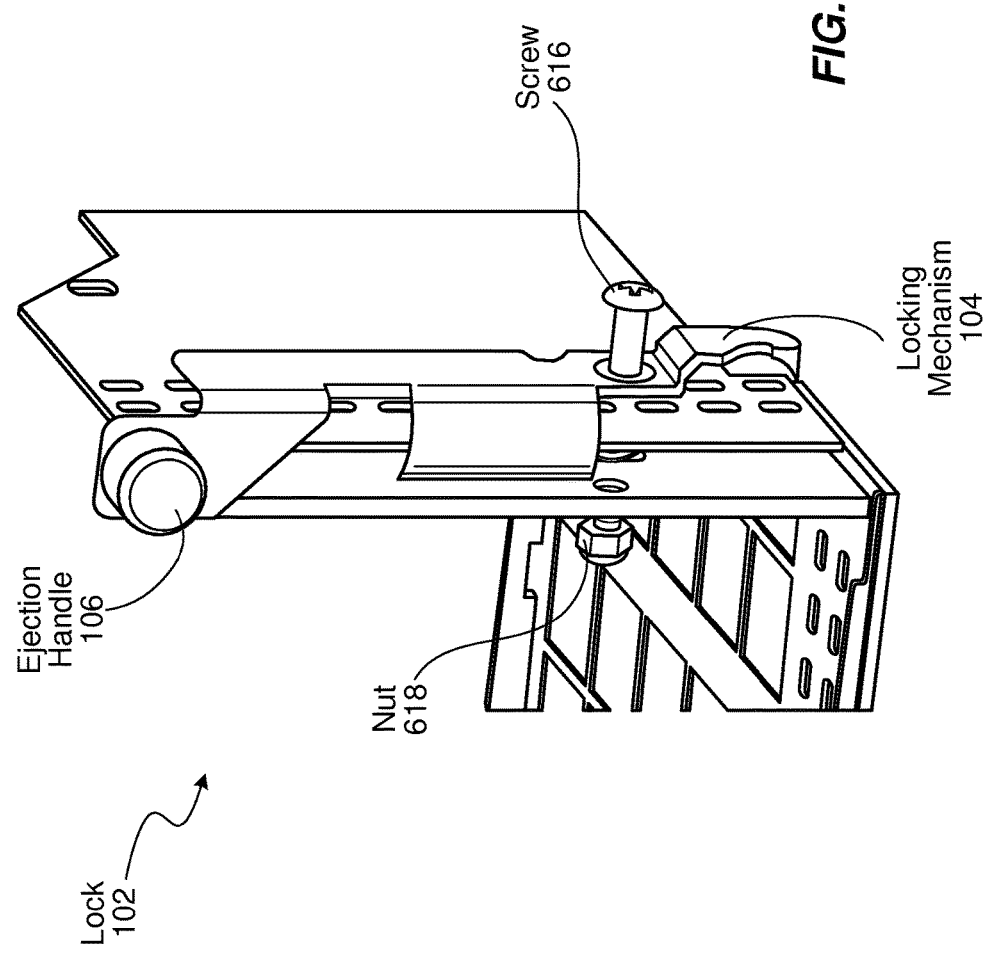
FIG. 6 is an illustration of an exemplary lock representing a portion of an apparatus for preventing electric shock during maintenance of telecommunication systems.

As exemplified in FIG. 6, lock 102 may include ejection handle 106 and locking mechanism 104 secured and/or attached to a chassis of the electronic module by a screw 616 and a nut 618. In addition to securing and/or attaching lock 102 to the chassis in this way, screw 616 and/or nut 618 may serve as an axis point around which lock 102 is able to move and/or rotate in response to the application of physical force. By moving and/or rotating around the axis point in this way, lock 102 may be able to secure and/or attach the electronic module to the telecommunication system. Additionally or alternatively, by moving and/or rotating around the axis point in this way, lock 102 may be able to free and/or eject the electronic module to the telecommunication system.

In one example, cross-bar 108 may be coupled to lock 102 and/or movable in conjunction with ejection handle 106. In this example, the application of physical force to ejection handle 106 may cause cross-bar 108 to move and/or rotate in addition to undoing locking mechanism 104. As will be described in greater detail below, cross-bar 108 may facilitate access to a row of power connectors arranged along a surface of the electronic module when the ejection handle is positioned in a first position. Additionally or alternatively, cross-bar 108 may block access to the row of power connectors arranged along the surface of the electronic module when the ejection handle is positioned in a second position.

Figure 2:
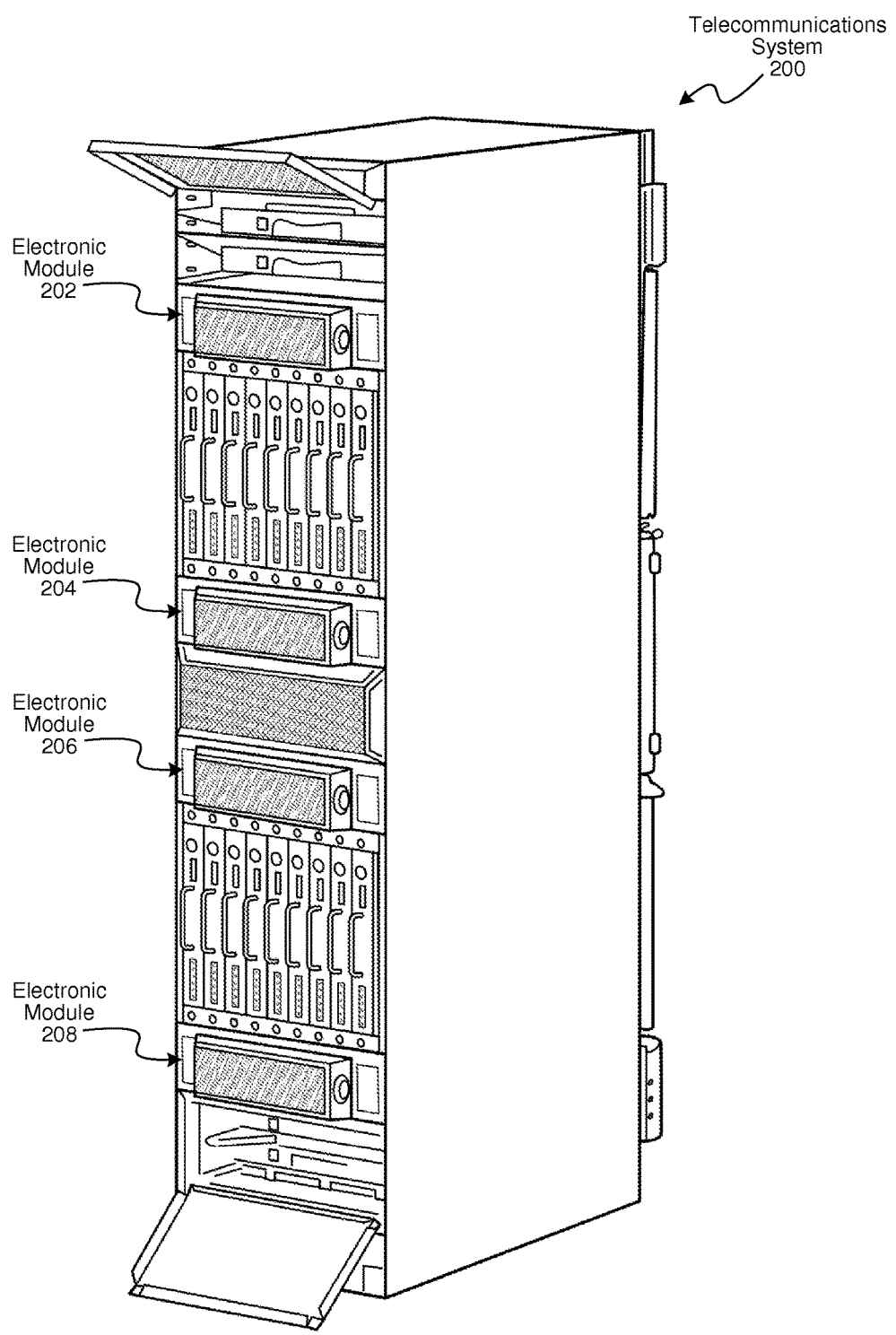
FIG. 2 is an illustration of an exemplary telecommunication system that may incorporate an apparatus for preventing electric shock during maintenance.

FIG. 2 shows an illustration of an exemplary telecommunication system 200 that may incorporate an apparatus for preventing electric shock during maintenance. As illustrated in FIG. 2, telecommunication system 200 may include and/or house electronic modules 202, 204, 206, and/or 208. In one example, one or more of electronic modules 202, 204, 206, and/or 208 in FIG. 2 may include and/or incorporate apparatus 100 (although not necessarily illustrated in FIG. 2) to prevent electric shock during maintenance performed on telecommunication system 200. Examples of telecommunication system 200 include, without limitation, routers, switches, bridges, network hubs, gateways, nodes, servers, racks or chasses housing one or more of the same, variations of one or more of the same, combinations of one or more of the same, or any other suitable telecommunication system.

In one example, one or more of electronic modules 202, 204, 206, and/or 208 in FIG. 2 may be field replaceable. For example, electronic module 202 may include and/or represent a field replaceable PDU that connects to and/or interfaces with the backplane of telecommunication system 200. In this example, a service worker may be able to replace the PDU after and/or while the PDU is deployed in telecommunication system 200. Examples of electronic modules 202, 204, 206 and/or 208 include, without limitation, PDUs, Alternating Current (AC) and/or Direct Current (DC) power supplies, transceivers, line cards, port modules, routing engines, switch control boards, variations of one or more of the same, combinations of one or more of the same, or any other suitable electronic module.

Figure 3:
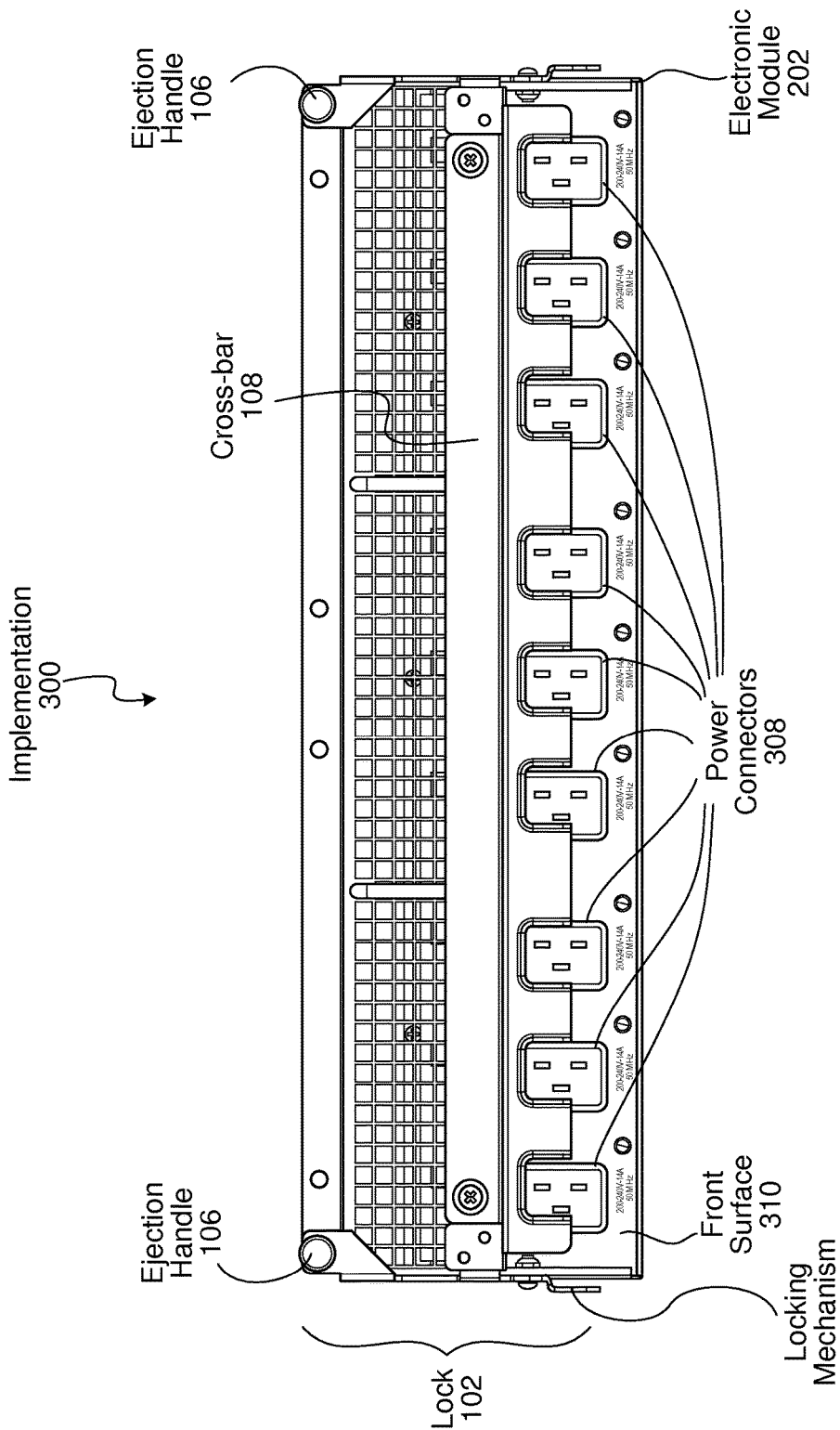
FIG. 3 is an illustration of an exemplary implementation of an apparatus for preventing electric shock during maintenance of telecommunication systems.

FIG. 3 shows an illustration of an exemplary implementation 300 of an apparatus for preventing electric shock during maintenance of telecommunication systems. As illustrated in FIG. 3, implementation 300 may include lock 102 and/or cross-bar 108 secured, attached, and/or mounted to electronic module 202. In this example, electronic module 202 may include a row of power connectors 308 arranged along a front surface 310.

In one example, power connectors 308 may include and/or represent female power receptacles designed to accept and/or interface with power cords. In this example, front surface 310 of electronic module 202 may represent the surface opposite to and/or facing away from the backplane of telecommunication system 200 when electronic module 202 is connected to telecommunication system 200 (not illustrated in FIG. 3).

In one example, cross-bar 108 may facilitate and/or provide access to power connectors 308 arranged along front surface 310 of electronic module 202 when ejection handle 106 is positioned in a first position. For example, when ejection handle 106 is positioned such that locking mechanism 104 is securing electronic module 202 to telecommunication system 200, cross-bar 108 may facilitate and/or provide access to power connectors 308. Accordingly, the first position may include and/or represent any position of ejection handle 106 that would potentially cause locking mechanism 104 to secure electronic module 202 to telecommunication system 200 if electronic module 202 were inserted in telecommunication system 200.

Additionally or alternatively, cross-bar 108 may block and/or prevent access to power connectors 308 arranged along front surface 310 of electronic module 202 when ejection handle 106 is positioned in a second position. For example, when ejection handle 106 is positioned such that locking mechanism 104 frees and/or ejects electronic module 202 from telecommunication system 200, cross-bar 108 may block and/or prevent access to power connectors 308. Accordingly, the second position may include and/or represent any position of ejection handle 106 that would leave locking mechanism 104 unlocked and/or undone such that electronic module 202 would not be properly secured to telecommunication system 200 if electronic module 202 were inserted in telecommunication system 200.

In one example, locking mechanism 104 may secure electronic module 202 to telecommunication system 200 when ejection handle 106 is moved from the second position to the first position. For example, a service worker may insert electronic module 202 into telecommunication system 200 and then apply physical force to move ejection handle 106 from the second position to the first position. By moving ejection handle 106 in this way, the service worker may effectively lock and/or close locking mechanism 104 such that electronic module 202 is secured to telecommunication system 200.

In contrast, locking mechanism 104 may free and/or loosen electronic module 202 from telecommunication system 200 when ejection handle 106 is moved from the first position to the second position. For example, a service worker may apply physical force to move ejection handle 106 from the first position to the second position. By moving ejection handle 106 in this way, the service worker may effectively unlock and/or open locking mechanism 104 such that electronic module 202 is freed and/or loosened from telecommunication system 200 for removal purposes.

Figure 4:
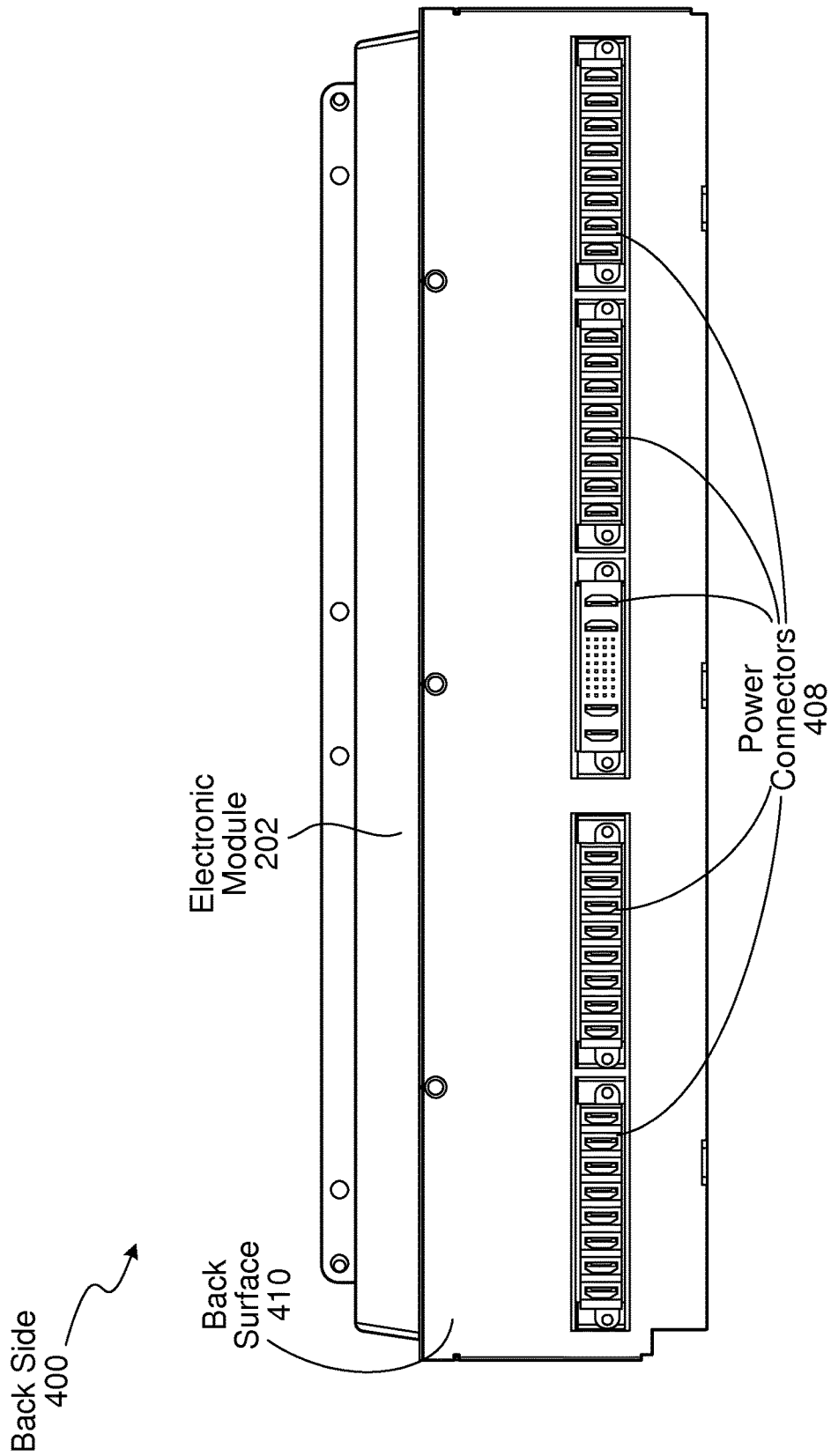
FIG. 4 is an illustration of an exemplary back side of an electronic module that may incorporate an apparatus for preventing electric shock during maintenance of telecommunication systems.

FIG. 4 shows an illustration of an exemplary back side 400 of electronic module 202. As illustrated in FIG. 4, back side 400 of electronic module 202 may include a row of power connectors 408 arranged along a back surface 410. In one example, power connectors 408 may include and/or represent male power connectors designed to fit into and/or mate with female power receptacles (e.g., female power receptacles arranged along the backplane of telecommunication system 200). In this example, back surface 410 of electronic module 202 may represent the surface closest to and/or directly facing the backplane of telecommunication system 200 when electronic module 202 is connected to telecommunication system 200 (not illustrated in FIG. 4).

In one example, power connectors 408 may be energized when power cords are connected to power connectors 308. For example, a power cord may be connected to and/or supplying power to one of power connectors 308 on front surface 310. As a result, one of power connectors 408 on back surface 410 may be energized (by, e.g., the power supplied by power cord) while the power cord is connected to the corresponding power connector on front surface 310.

Figure 5:
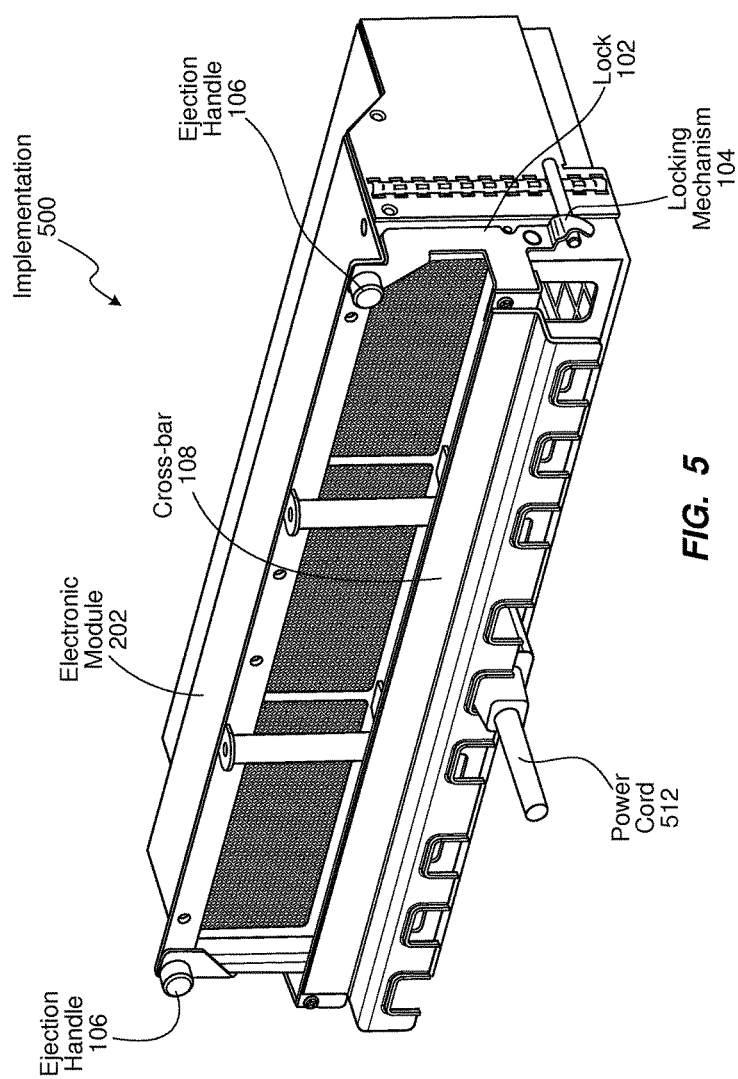
FIG. 5 is an illustration of an exemplary implementation of an apparatus for preventing electric shock during maintenance of telecommunication systems.

FIG. 5 shows an illustration of an exemplary implementation 500 of an apparatus for preventing electric shock during maintenance of telecommunication systems. As illustrated in FIG. 5, implementation 500 may include lock 102 and/or cross-bar 108 secured, attached, and/or mounted to electronic module 202. In this example, ejection handle 106 may be positioned in the first position such that locking mechanism 104 secures electronic module 202 to telecommunication system 200 (not necessarily illustrated in FIG. 5) and cross-bar 108 facilitates and/or provides access to the power connectors arranged along the front surface of electronic module 202. Accordingly, the first position of ejection handle 106 may enable a power cord 512 to be connected to and/or inserted in one of the power connectors arranged along the front surface of electronic module 202.

In one example, cross-bar 108 may necessitate the removal of all power cords from the power connectors arranged along the front surface of electronic module 202 prior to the ejection of electronic module 202 from telecommunication system 200. For example, a service worker may need to unplug power cord 512 in order to eject and/or remove electronic module 202 from telecommunication system 200. In other words, while power cord 512 is plugged into the corresponding power connector, cross-bar 108 may press against power cord 512 as the service worker applies physical force to ejection handle 106, thereby preventing the service worker from moving ejection handle 106 from the first position to the second position. As a result, the service worker may be unable to undo locking mechanism 104 or eject and/or remove electronic module 202 from telecommunication system 200 until first removing power cord 512 from the power connector.

In other words, cross-bar 108 may prevent the ejection of electronic module 202 from telecommunication system 200 by impairing the movement of ejection handle 106 when power cord 512 is connected to and/or inserted in any power connector on the front surface of electronic module 202. For example, a service worker may apply physical force to ejection handle 106 while power cord 512 is connected to and/or inserted in the corresponding power connector on the front surface of electronic module 202. Since, in this example, power cord 512 is connected to and/or inserted in the corresponding power connector on the front surface of electronic module 202, cross-bar 108 may impair the movement of ejection handle 106 from the first position to the second position despite the application of physical force.

By necessitating the removal of all power cords from the power connectors prior to the ejection of electronic module 202, cross-bar 108 may mitigate the service worker's risk of suffering electric shock. For example, in the event that power cord 512 is connected to a female power receptacle on the front side of electronic module 202, a corresponding male power connector on the back side of electronic module 202 may be energized, thereby potentially exposing the service worker to electric shock upon disconnecting electronic module 202 from the backplane for maintenance and/or replacement purposes. However, cross-bar 108 may essentially require the service worker to remove power cord 512 from the female power receptacle before the service worker is able to undo locking mechanism 104 and/or eject electronic module 202 from telecommunication system 200.

Figure 7:
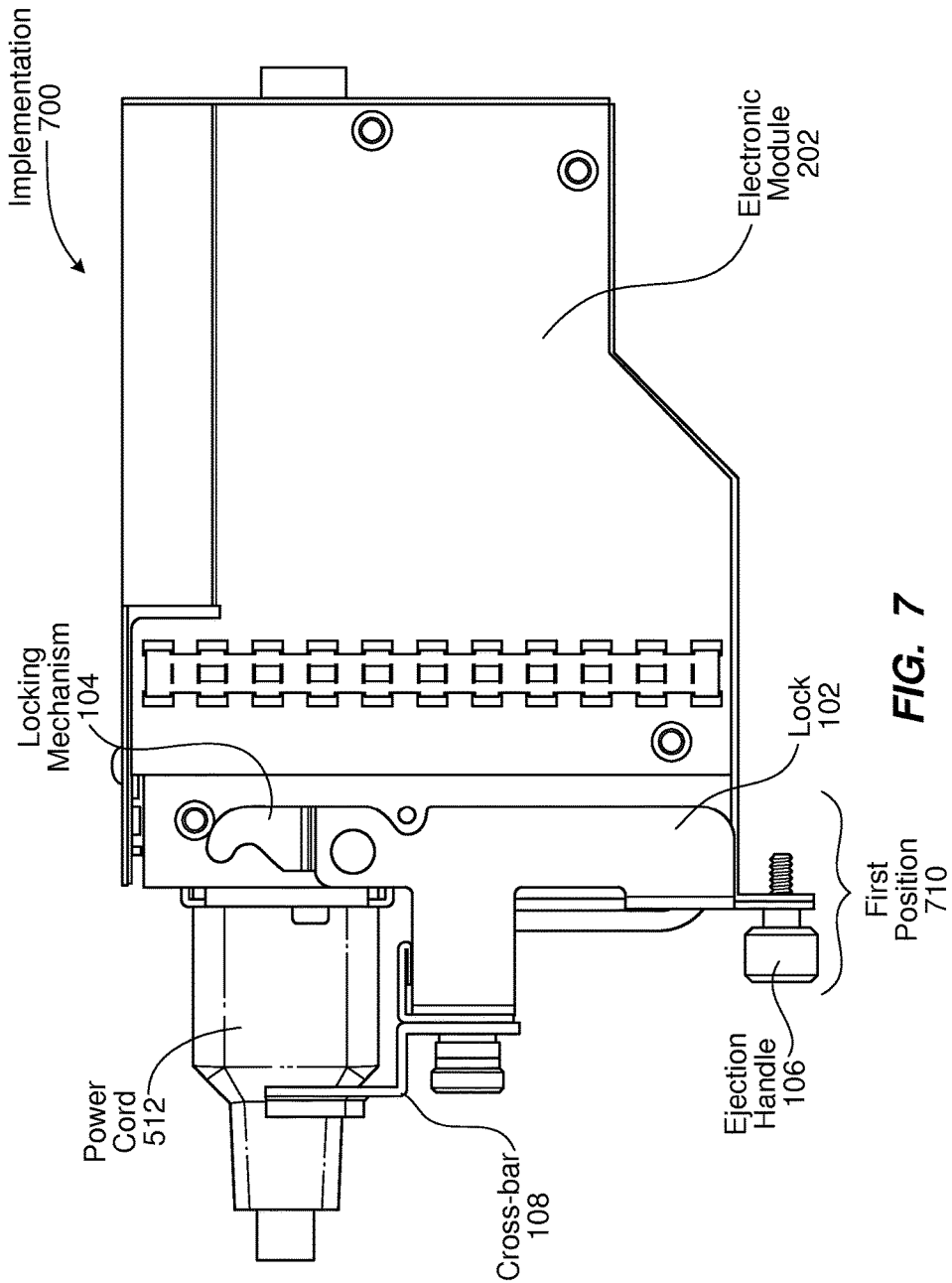
FIG. 7 is an illustration of an exemplary implementation of an apparatus for preventing electric shock during maintenance of telecommunication systems.

FIG. 7 shows a side-view illustration of an exemplary implementation 700 of an apparatus for preventing electric shock during maintenance of telecommunication systems. As illustrated in FIG. 7, implementation 700 may include lock 102 and/or cross-bar 108 secured, attached, and/or mounted to electronic module 202. In this example, ejection handle 106 may be positioned in a first position 710 such that locking mechanism 104 secures electronic module 202 to telecommunication system 200 (not necessarily illustrated in FIG. 7) and cross-bar 108 facilitates and/or provides access to the power connectors arranged along the front surface of electronic module 202. Accordingly, first position 710 of ejection handle 106 may enable power cord 512 to be connected to and/or inserted in one of the power connectors arranged along the front surface of electronic module 202.

Figure 8:
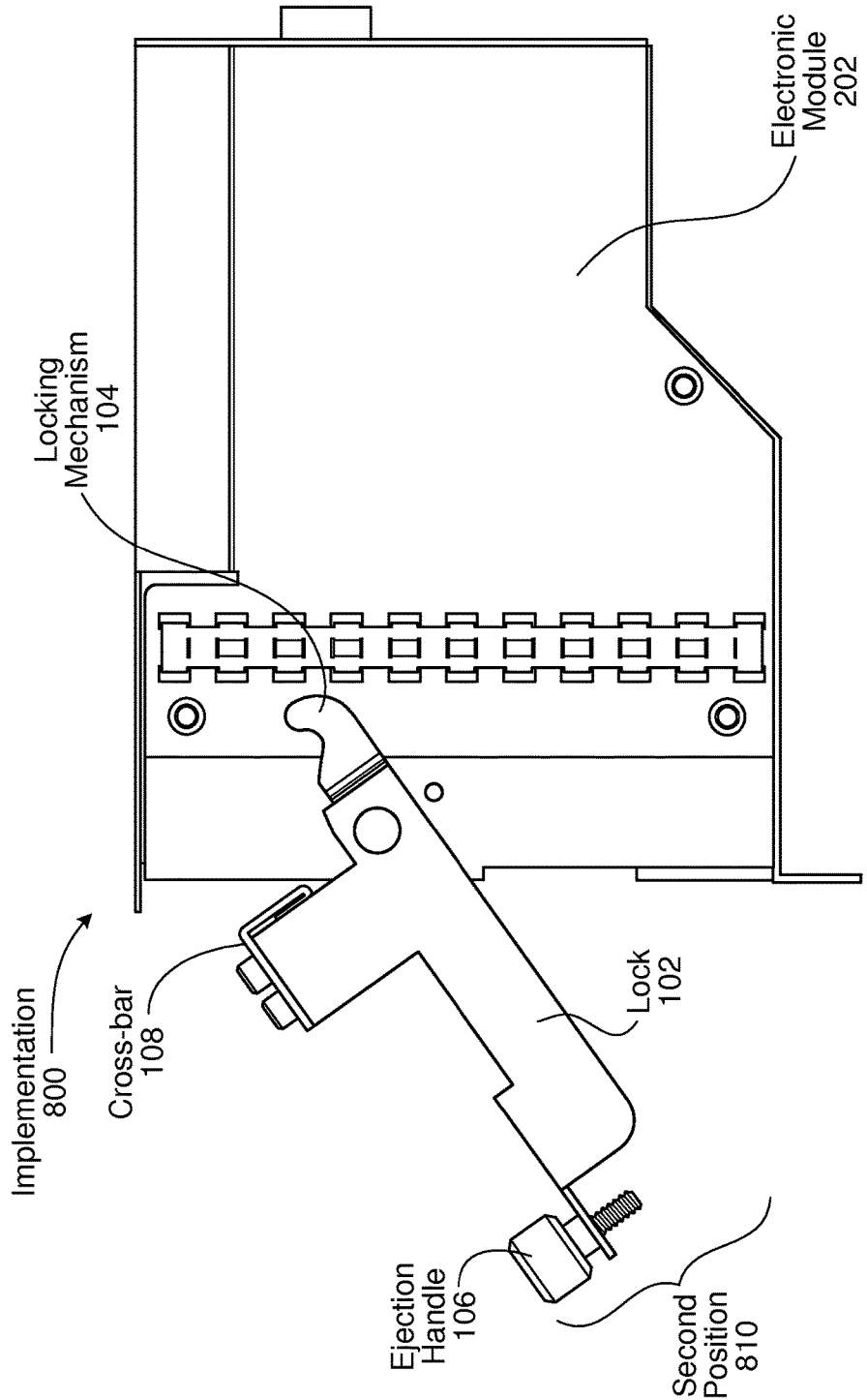
FIG. 8 is an illustration of an exemplary implementation of an apparatus for preventing electric shock during maintenance of telecommunication systems.

FIG. 8 shows a side-view illustration of an exemplary implementation 800 of an apparatus for preventing electric shock during maintenance of telecommunication systems. As illustrated in FIG. 8, implementation 800 may include lock 102 and/or cross-bar 108 secured, attached, and/or mounted to electronic module 202. In this example, ejection handle 106 may be positioned in a second position 810 such that locking mechanism 104 is unlocked and/or undone relative to telecommunication system 200 (not necessarily illustrated in FIG. 8) and cross-bar 108 blocks and/or prevents access to the power connectors arranged along the front surface of electronic module 202. Accordingly, second position 810 of ejection handle 106 may prevent power cord 512 from being connected to and/or inserted in any of the power connectors arranged along the front surface of electronic module 202.

As an example, cross-bar 108 may prevent a service worker from establishing a connection between power cord 512 and any of the power connectors arranged along the front surface of electronic module 202 when ejection handle 106 is positioned in second position 810. For example, after removing electronic module 202 from telecommunication system 200 for maintenance purposes, the service worker may attempt to insert power cord 512 back into one of the power connectors arranged along the front surface of electronic module 202 even though ejection handle 106 is positioned in second position 810. However, since ejection handle 106 is positioned in second position 810, cross-bar 108 may prevent the service worker from actually inserting power cord 512 into any of these power connectors during his or her attempt. By preventing the service worker from inserting power cord 512 in this way, cross-bar 108 may mitigate the risk of electric shock to the service worker performing maintenance on telecommunication system 200.

Figure 9:
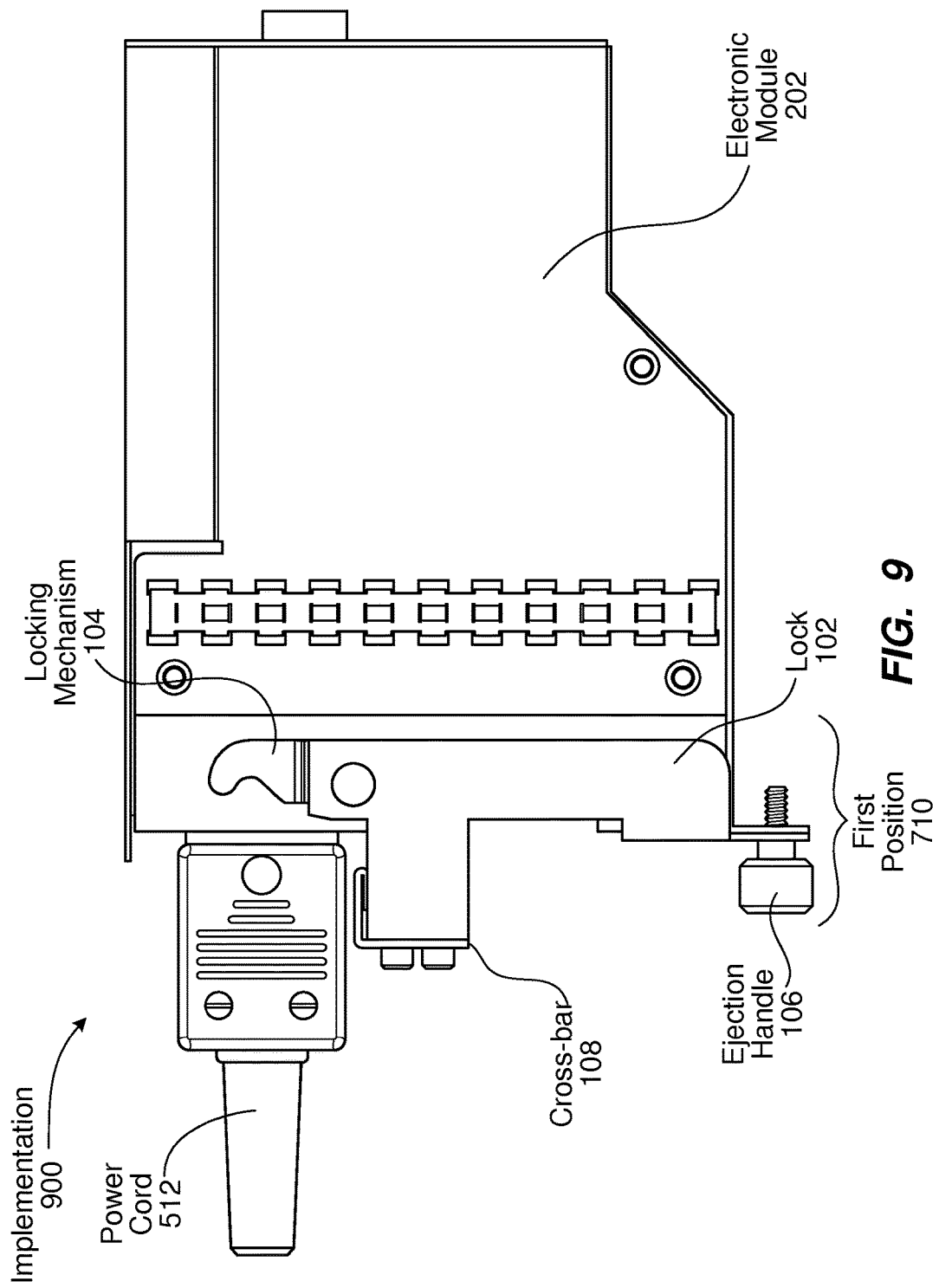
FIG. 9 is an illustration of an exemplary implementation of an apparatus for preventing electric shock during maintenance of telecommunication systems.

FIG. 9 shows a side-view illustration of an exemplary implementation 900 of an apparatus for preventing electric shock during maintenance of telecommunication systems. As illustrated in FIG. 9, implementation 900 may include lock 102 and/or cross-bar 108 secured, attached, and/or mounted to electronic module 202. In this example, ejection handle 106 may be positioned in a first position 710 such that locking mechanism 104 secures electronic module 202 to telecommunication system 200 (not necessarily illustrated in FIG. 9) and cross-bar 108 facilitates and/or provides access to the power connectors arranged along the front surface of electronic module 202. Accordingly, first position 710 of ejection handle 106 may enable power cord 512 to be connected to and/or inserted in one of the power connectors arranged along the front surface of electronic module 202.

Figure 10:
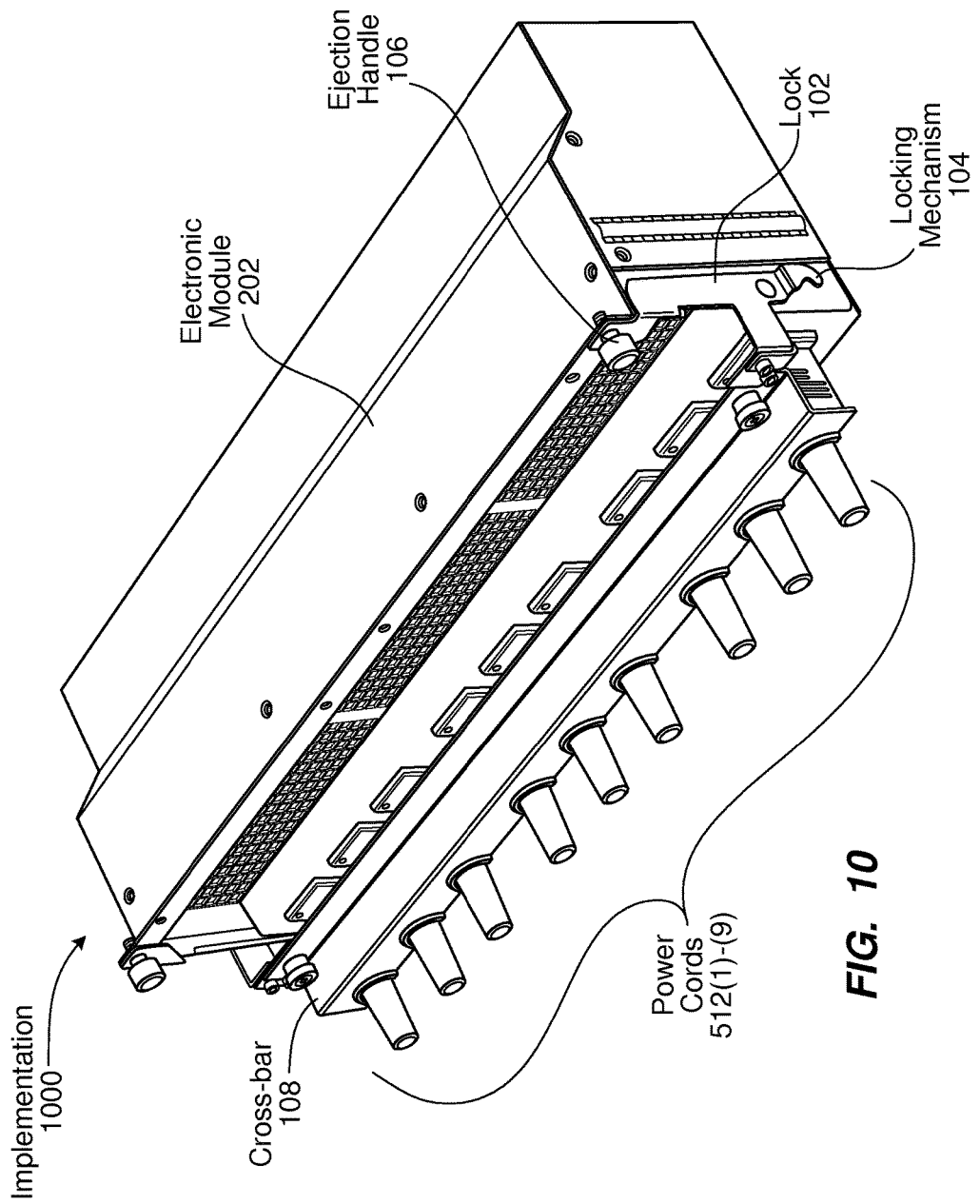
FIG. 10 is an illustration of an exemplary implementation of an apparatus for preventing electric shock during maintenance of telecommunication systems.

FIG. 10 shows an illustration of an exemplary implementation 1000 of an apparatus for preventing electric shock during maintenance of telecommunication systems. As illustrated in FIG. 10, implementation 1000 may include lock 102 and/or cross-bar 108 secured, attached, and/or mounted to electronic module 202. In this example, ejection handle 106 may be positioned in the first position such that locking mechanism 104 secures electronic module 202 to telecommunication system 200 (not necessarily illustrated in FIG. 10) and cross-bar 108 facilitates and/or provides access to the power connectors arranged along the front surface of electronic module 202. Accordingly, the first position of ejection handle 106 may enable power cords 512(1)-(9) to be connected to and/or inserted in the power connectors arranged along the front surface of electronic module 202. In addition, cross-bar 108 may include a cord retention piece that retains and/or holds power cords 512(1)-(9) in place while electronic module 202 is secured to telecommunication system 200.

Figure 11:
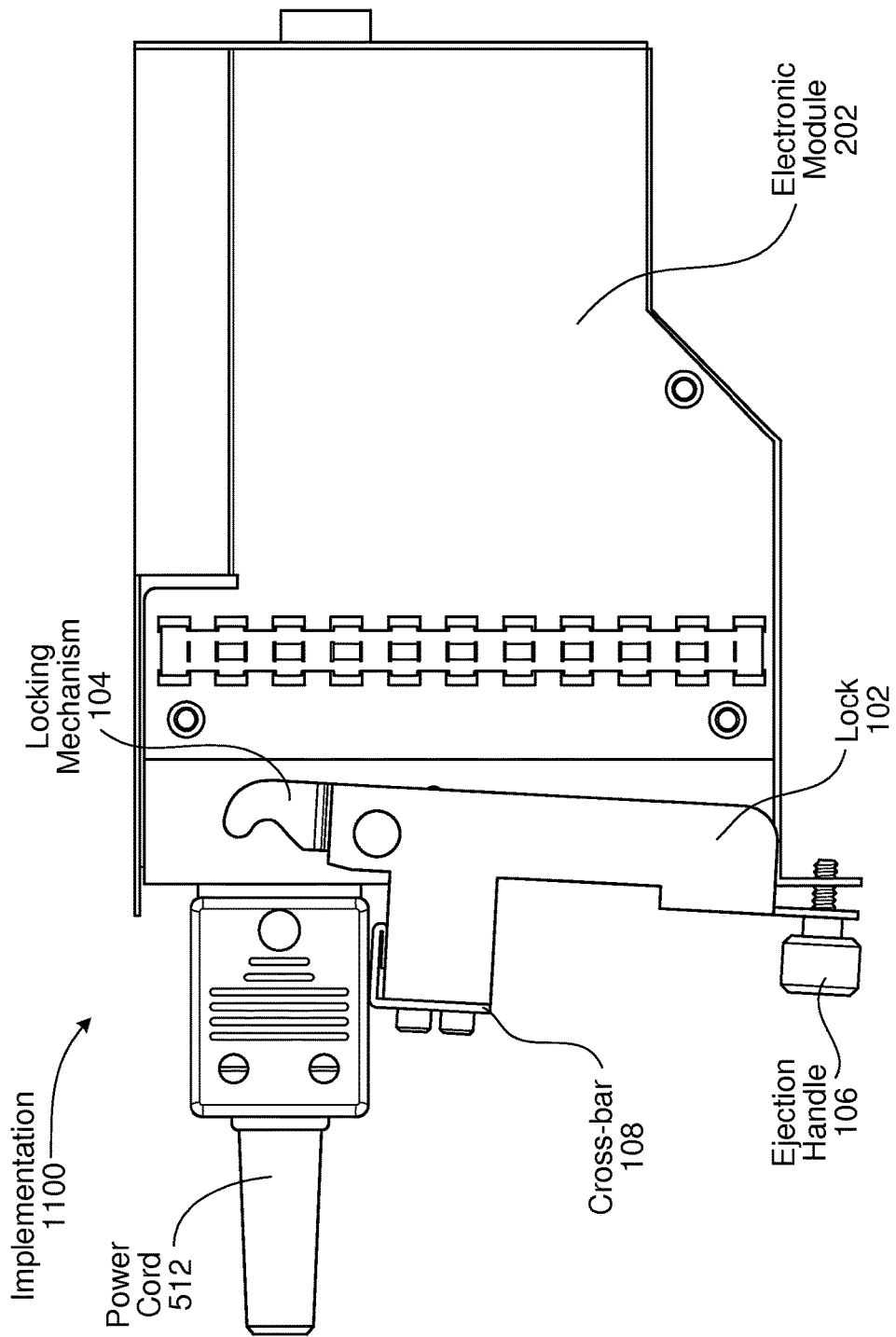
FIG. 11 is an illustration of an exemplary implementation of an apparatus for preventing electric shock during maintenance of telecommunication systems.

FIG. 11 shows a side-view illustration of an exemplary implementation 1100 of an apparatus for preventing electric shock during maintenance of telecommunication systems. As illustrated in FIG. 11, implementation 1100 may include lock 102 and/or cross-bar 108 secured, attached, and/or mounted to electronic module 202. In this example, ejection handle 106 may be moved away from the first position in an attempt to free and/or eject electronic module 202 from telecommunication system 200 (not necessarily illustrated in FIG. 9) by unlocking and/or undoing locking mechanism

104. For example, a service worker may attempt to move ejection handle 106 from the first position to the second position to free and/or eject electronic module 202. However, since power cord 512 is connected to and/or inserted in one of the power connectors on the front surface of electronic module 202, cross-bar 108 may prevent the service worker from freeing and/or ejecting electronic module 202 by impairing the movement of ejection handle 106.

Figure 12:
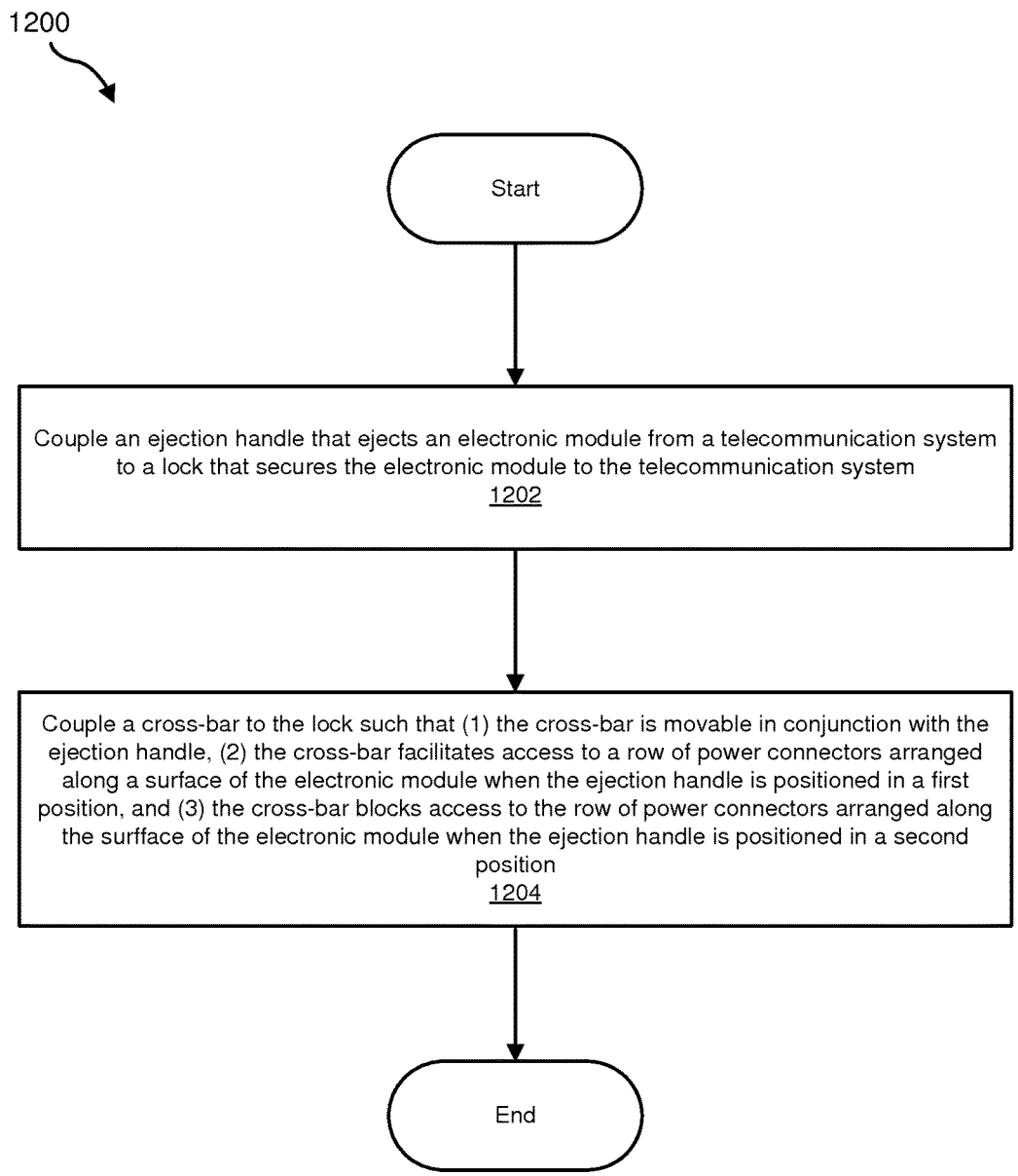
FIG. 12 is an illustration of an exemplary method for preventing electric shock during maintenance of telecommunication systems.

FIG. 12 is a flow diagram of an exemplary method 1200 for preventing electric shock during maintenance of telecommunication systems. Method 1200 may include the step of coupling an ejection handle that ejects an electronic module from a telecommunication system to a lock that secures the electronic module to the telecommunication system (1202). This coupling step may be performed in a variety of ways. For example, a telecommunication equipment manufacturer may manufacture electronic module 202 that interfaces with the backplane of telecommunication system 200. When manufacturing the electronic module, the telecommunications equipment manufacturer may couple ejection handle 106 that ejects electronic module 202 from telecommunication system 200 to lock 102 that secures electronic module 202 to telecommunication system 200.

Additionally or alternatively, the telecommunication equipment manufacturer may utilize computer-controlled and/or automated robotics to couple ejection handle 106 to lock 102. For example, the telecommunication equipment manufacturer may implement a robotic assembly system that includes certain combinations of hardware, software, and/or firmware. In this example, the robotic assembly system may control a hardware-based robotic tool that physically couples ejection handle 106 to lock 102 as directed and/or programmed by certain software and/or firmware modules.

Returning to FIG. 12, method 1200 may also include the step of coupling a cross-bar to the lock such that (1) the cross-bar is movable in conjunction with the ejection handle, (2) the cross-bar facilitates access to a row of power connectors arranged along a surface of the electronic module when the ejection handle is positioned in a first position, and (3) the cross-bar blocks access to the row of power connectors arranged along the surface of the electronic module when the ejection handle is positioned in a second position (1204). This coupling step may be performed in a variety of ways. For example, as indicated above, a telecommunication equipment manufacturer may manufacture electronic module 202 that interfaces with the backplane of telecommunication system 200. When manufacturing electronic module 202, the telecommunication equipment manufacturer may couple cross-bar 108 to lock 102 such that (1) cross-bar 108 is movable in conjunction with ejection handle 106, (2) cross-bar 108 facilitates access to a row of power connectors 308 arranged along front surface 310 of electronic module 202 when ejection handle 106 is positioned in first position 710, and (3) cross-bar 108 blocks access to the row of power connectors 308 arranged along front surface 310 of electronic module 202 when ejection handle 106 is positioned in second position 810.

Additionally or alternatively, the telecommunication equipment manufacturer may utilize computer-controlled and/or automated robotics to couple cross-bar 108 to lock 102 in such a way. For example, as indicated above, the telecommunication equipment manufacturer may implement a robotic assembly system that includes certain combinations of hardware, software, and/or firmware. In this example, the robotic assembly system may control a hardware-based robotic tool that physically couples cross-bar 108 to lock 102 as directed and/or programmed by certain software and/or firmware modules. As a result of this physical coupling, cross-bar 108 may (1) be movable in conjunction with ejection handle 106, (2) facilitate access to the row of power connectors 308 arranged along front surface 310 of electronic module 202 when ejection handle 106 is positioned in first position 710, and/or (3) block access to the row of power connectors 308 arranged along front surface 310 of electronic module 202 when ejection handle 106 is positioned in second position 810.

In some examples, method 1200 may further include one or more additional steps not illustrated in FIG. 12. As an example, method 1200 may include the step of ensuring that all power cords are removed from the row of power connectors prior to ejection of the electronic module from the telecommunication system. For example, the coupling of locking mechanism 104, ejection handle 106, and/or cross-bar 108 may ensure that all power cords are removed from the row of power connectors 308 prior to ejection of electronic module 202 from telecommunication system 200, thereby mitigating the risk of electric shock to a service worker performing maintenance on telecommunication system 200.

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a lock that comprises:
      a locking mechanism that secures an electronic module to a telecommunication system; and
      an ejection handle coupled to the locking mechanism such that application of physical force to the ejection handle ejects the electronic module from the telecommunication system by undoing the locking mechanism; and
   a cross-bar coupled to the lock and movable in conjunction with the ejection handle such that:
      the cross-bar facilitates access to a row of power connectors arranged along a surface of the electronic module when the ejection handle is positioned in a first position;
      the cross-bar blocks access to the row of power connectors arranged along the surface of the electronic module when the ejection handle is positioned in a second position; and
      the cross-bar prevents insertion of a power cord into any power connector within the row of power connectors when the ejection handle is positioned in the second position.

2. The apparatus of claim 1, wherein the locking mechanism secures the electronic module to the telecommunication system when the ejection handle is moved from the second position to the first position.

3. The apparatus of claim 1, wherein:
   the locking mechanism does not secure the electronic module to the telecommunication system when the ejection handle is positioned in the second position; and
   the application of physical force to the ejection handle ejects the electronic module from the telecommunication system by moving the ejection handle from the first position to the second position.

4. The apparatus of claim 1, wherein the cross-bar prevents establishing a connection between a power cord and any power connector within the row of power connectors when the ejection handle is positioned in the second position.

5. The apparatus of claim 1, wherein the cross-bar necessitates removal of all power cords from the row of power connectors prior to ejection of the electronic module from the telecommunication system.

6. The apparatus of claim 1, wherein the cross-bar prevents ejection of the electronic module from the telecommunication system by impairing movement of the ejection handle from the first position to the second position despite the application of physical force when a power cord is connected to any power connector within the row of power connectors.

7. The apparatus of claim 1, wherein the electronic module comprises a field replaceable power distribution unit.

8. The apparatus of claim 1, further comprising another row of power connectors arranged along another surface of the electronic module, at least one power connector within the other row of power connectors being energized when a power cord is connected to a corresponding power connector within the row of power connectors.

9. A system comprising:
   an electronic module that interfaces with a telecommunication system;
   a lock coupled to the electronic module, wherein the lock comprises:
      a locking mechanism that secures the electronic module to the telecommunication system; and
      an ejection handle coupled to the locking mechanism such that application of physical force to the ejection handle ejects the electronic module from the telecommunication system by undoing the locking mechanism; and
   a cross-bar coupled to the lock and movable in conjunction with the ejection handle such that:
      the cross-bar facilitates access to a row of power connectors arranged along a surface of the electronic module when the ejection handle is positioned in a first position;
      the cross-bar blocks access to the row of power connectors arranged along the surface of the electronic module when the ejection handle is positioned in a second position; and
      the cross-bar prevents insertion of a power cord into any power connector within the row of power connectors when the ejection handle is positioned in the second position.

10. The system of claim 9, wherein the locking mechanism secures the electronic module to the telecommunication system when the ejection handle is moved from the second position to the first position.

11. The system of claim 9, wherein:
    the locking mechanism does not secure the electronic module to the telecommunication system when the ejection handle is positioned in the second position; and
    the application of physical force to the ejection handle ejects the electronic module from the telecommunication system by moving the ejection handle from the first position to the second position.

12. The system of claim 9, wherein the cross-bar prevents establishing a connection between a power cord and any power connector within the row of power connectors when the ejection handle is positioned in the second position.

13. The system of claim 9, wherein the cross-bar necessitates removal of all power cords from the row of power connectors prior to ejection of the electronic module from the telecommunication system.

14. The system of claim 9, wherein the cross-bar prevents ejection of the electronic module from the telecommunication system by impairing movement of the ejection handle from the first position to the second position despite the application of physical force when a power cord is connected to any power connector within the row of power connectors.

15. The system of claim 9, wherein the electronic module comprises a field replaceable power distribution unit.

16. The system of claim 9, further comprising another row of power connectors arranged along another surface of the electronic module, at least one power connector within the other row of power connectors being energized when a power cord is connected to a corresponding power connector within the row of power connectors.

17. A method comprising:
    coupling an ejection handle that ejects an electronic module from a telecommunication system to a lock that secures the electronic module to the telecommunication system; and
    coupling a cross-bar to the lock such that:
       the cross-bar is movable in conjunction with the ejection handle;

the cross-bar facilitates access to a row of power connectors arranged along a surface of the electronic module when the ejection handle is positioned in a first position;

the cross-bar blocks access to the row of power connectors arranged along the surface of the electronic module when the ejection handle is positioned in a second position; and the cross-bar prevents insertion of a power cord into any power connector within the row of power connectors when the ejection handle is positioned in the second position.

18. The method of claim 17, further comprising ensuring that all power cords are removed from the row of power connectors prior to ejection of the electronic module from the telecommunication system.

* * * * *